(12) United States Patent
Gerlitzki

(10) Patent No.: US 12,152,181 B2
(45) Date of Patent: Nov. 26, 2024

(54) QUANTUM MATERIALS HAVING IMPROVED CHARGE TRANSFER FOR USE IN OPTOELECTRONIC SEMICONDUCTOR COMPONENTS

(71) Applicant: OSRAM Opto Semiconductors GmbH, Regensburg (DE)

(72) Inventor: Niels Gerlitzki, Schemmerhofen (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 639 days.

(21) Appl. No.: 17/422,759

(22) PCT Filed: Jan. 16, 2020

(86) PCT No.: PCT/EP2020/050998
§ 371 (c)(1),
(2) Date: Jul. 14, 2021

(87) PCT Pub. No.: WO2020/148371
PCT Pub. Date: Jul. 23, 2020

(65) Prior Publication Data
US 2022/0135873 A1    May 5, 2022

(30) Foreign Application Priority Data

Jan. 17, 2019   (DE) .................... 10 2019 101 217.1

(51) Int. Cl.
*C09K 11/02*    (2006.01)
*B82Y 20/00*    (2011.01)
(Continued)

(52) U.S. Cl.
CPC .......... *C09K 11/025* (2013.01); *C09K 11/883* (2013.01); *H10K 85/654* (2023.02);
(Continued)

(58) Field of Classification Search
CPC .... C09K 11/025; C09K 11/883; H10K 50/115
See application file for complete search history.

(56) References Cited

U.S. PATENT DOCUMENTS

2014/0246094 A1   9/2014  Caputo
2015/0315460 A1   11/2015 Gim et al.
(Continued)

FOREIGN PATENT DOCUMENTS

WO    2013030737 A1    3/2013

OTHER PUBLICATIONS

Lian et al.: "Subpicosecond Photoinduced Hole Transfer from a CdS Quantum Dot to a Molecular Acceptor Bound Through an Exciton-Delocalizing Ligand", ACS NANO; Jun. 13, 2016; vol. 10; Issue 6; 11 pages, pp. 6372-6382.*

(Continued)

*Primary Examiner* — C Melissa Koslow
(74) *Attorney, Agent, or Firm* — VIERING, JENTSCHURA & PARTNER mbB

(57) ABSTRACT

A quantum dot material may include a quantum dot having at least two ligand where each ligand includes a first and a second functional group bound to each other by a bridge. The bridge may include a system of conjugated double bonds. In at least one ligand, the second functional group may have an electron transport structure. In at least one ligand, the second functional group may have a hole transport structure.

12 Claims, 8 Drawing Sheets

(51) Int. Cl.
*B82Y 40/00* (2011.01)
*C09K 11/88* (2006.01)
*H10K 50/115* (2023.01)
*H10K 85/60* (2023.01)

(52) U.S. Cl.
CPC .......... *H10K 85/6572* (2023.02); *B82Y 20/00* (2013.01); *B82Y 40/00* (2013.01); *H10K 50/115* (2023.02)

(56) References Cited

U.S. PATENT DOCUMENTS

2018/0215695 A1　8/2018　Chen et al.
2018/0342692 A1　11/2018　Rausch et al.
2020/0067006 A1*　2/2020　Ippen ................ H10K 50/15

OTHER PUBLICATIONS

Kroupa et al : "Optical absorbance enhancement in PbS QD/Cinnamate ligands complexes", Journal of Physical Chemistry Letters; Jun. 1, 2018; vol. 3; Issue 15; 15 pages.*

Kim, Yohan, "Design of High Performance Indium Phosphide (InP)—based Quantum Dot Light Emitting Diodes (QLEDs)", Dissertation, May 2, 2018, 205 pages.

Talapin, Dmitri V. et al., "Quantum dot light-emitting devices", Materials Research Society Bulletin, Sep. 2013, pp. 685-691, vol. 38, USA.

Bae, Wan Ki et al., "Spectroscopic insigths into the performance of quantum dot light-emitting diodes", Materials Research Society Bulletin, Sep. 2013, pp. 721-730, vol. 38, USA.

International search report, issued for the corresponding PCT Application No. PCT/EP2020/050998, mailed Mar. 25, 2020, 6 pages (For informational purposes only).

Search report issued for the corresponding German Patent Application No. 10 2019 101 217.1 issued on Sep. 25, 2019, 6 pages (For informational purposes only).

Planells et al.: "Synthesis and optical characterisation of thriphenylamine-based hole extractor materials for CdSe quantum dots"; Physical Chemistry Chemical Physics, Jan. 1, 2013; vol. 15; Issue 20; 6 pages.

Lian et al.: "Subpicosecond Photoinduced Hole Transfer from a CdS Quantum Dot to a Molecular Acceptor Bound Through an Exciton-Delocalizing Ligand" ACS NANO; Jun. 13, 2016; vol. 10; Issue 6; 11 pages.

Liang et al.: "Functionalization of CdSe semiconductor nanocrystals with organic charge-transporting ligands"; Journal of Materials Chemistry; Mar. 18, 2015; vol. 3; Issue 16; 7 pages.

Kroupa et al.: Optical absorbance enhancement in PbS QD/connamate ligans complexes. Journal of Physical Checmics Letters; Jun. 1, 2018; vol. 3; Issue 15; 15 pages.

* cited by examiner

QUANTUM MATERIALS HAVING IMPROVED CHARGE TRANSFER FOR USE IN OPTOELECTRONIC SEMICONDUCTOR COMPONENTS

CROSS-REFERENCE TO RELATED APPLICATIONS

The present application is a national stage entry according to 35 U.S.C. § 371 of PCT Application No. PCT/EP2020/050998 filed on Jan. 16, 2020; which claims priority to German Patent Application Serial No. 10 2019 101 217.1 filed on Jan. 17, 2019; all of which are incorporated herein by reference in their entirety and for all purposes.

TECHNICAL FIELD

The present invention relates to quantum materials having improved charge transfer for use in optoelectronic semiconductor components.

BACKGROUND

In optoelectronic semiconductor components, quantum materials can be used for the emission of light, which are incorporated into a component architecture similar to that of OLED (organic light-emitting diode). However, such optoelectronic semiconductor components in which the quantum materials are electrically excited often exhibit poor performance and insufficient emission of light, which also suggests insufficient charge transfer of positive and/or negative charge carriers to the quantum material (QM), and, as a result, insufficient recombination of the charge carriers on the quantum material. This is especially true for cadmium-free quantum materials.

In order to be able to utilize light emission via electrical excitation with quantum materials, a balanced charge transfer of positive and negative charge carriers to the quantum material is required. This can be achieved, for example, by a component architecture similar to that of the OLED, for example, which contains functional layers in addition to the emission layer to ensure charge transfer within and charge injection into the optoelectronic semiconductor component. In the OLED, this component architecture can be created, for example, by vapor deposition of the materials to form a layer stack.

However, the mostly inorganic quantum materials cannot be introduced into such a layer stack by vapor deposition because they decompose under the conditions of vapor deposition or the vapor deposition temperature would be too high such that integrity of the component is no longer guaranteed. As an alternative to vapor deposition a method of liquid processing to create the layer stack is provided, although various approaches are also conceivable herein, such as spin coating, doctor knife coating, spray coating, inkjet printing, etc. It is possible to produce all functional layers by liquid processing or to produce only parts of the layer stack (a so-called hybrid approach).

To enable liquid processing of the quantum materials, the quantum materials are required to be present in an ink in which the quantum materials are mostly suspended or dispersed in an organic solvent or solvent mixture. In turn, in order for the quantum materials to be stably and uniformly suspended or dispersed in an ink, they require a mostly organic layer (a so-called ligand shell) that enables stable dispersion or suspension of the quantum materials in a solvent (mixture) suitable for liquid processing.

Such organic ligand shells mostly consist of residues of organic acids adhering to the outer inorganic shell of the quantum dot, such as caprylates, oleates, stearates, palmitates, myristates and/or other long-chain carboxylic acid anions, but also, for example, long-chain aliphatic alcoholates, thiolates or trialkylphosphites. However, the disadvantage of such ligands, which mostly consist of saturated long-chain hydrocarbon chains, is that they do not, or only to a very limited extent, support the charge transfer to the actual core of the quantum material, i.e. the quantum dot, thus negatively affecting or suppressing electrical excitation of the quantum dot.

Approaches are known in which molecular structures are combined with charge transfer properties (herein mainly hole transport properties) and long-chain carboxylic acid anions to achieve improved recombination rate of charge carriers on the quantum material and associated emission of discrete wavelengths. However, these approaches so far have not shown to provide improvement in performance of the quantum materials in optoelectronic semiconductor components.

SUMMARY

Thus, one objective was to overcome the disadvantages of prior art and to provide a new quantum material, a new method of producing a quantum material, a new optoelectronic semiconductor component, and the use of an optoelectronic semiconductor component.

An objective is a quantum material comprising: a quantum dot having at least one ligand, wherein at least one of the ligands comprises:
  a first functional group and a second functional group bound by a bridge,
  wherein the bridge comprises a system of conjugated double bonds.

By a quantum dot, a nanoscopic material structure is to be understood, which often is a semiconductor material. Quantum dots may have a so-called core-shell architecture. In this case, the energy difference of the band gap between the core semiconductor material and the shell material is, for example, 0.5 eV. The band gap of the shell material is larger than that of the core material. As the semiconductor material for the shell material, CdS, CdSe, CdTe, ZnS, ZnSe, ZnTe, HgTe, HgSe, GaP, GaAs, GaSb, AlP, AlAs, AlSb, InP, InAs, InSb, SiC, InN, AlN or mixed crystals thereof (ternary, quaternary, etc.) or any combination of several different semiconductor materials may be used.

For example, as the core semiconductor material InP, CdSe, CdS, $CuInS_2$, $CuInSe_2$, or PbS may be used.

In one embodiment, the at least one quantum dot comprises one or more materials selected from the group consisting or PbS, HgS, HgTe, $CuInS_2$, $CuInSe_2$, CdS, CdSe CdTe, ZnS, ZnSe, ZnTe, HgTe, HgSe, GaP, GaAs, GaSb, AlP, AlAs, AlSb, InP, InAs, InSb, GaSb, SiC, InN, AlN, GaN, BN, ZnO, MgO, $InSnO_2$, $SnO_2$, or combinations thereof. In one aspect of this embodiment, the quantum dot only has a core and no shell. In a non-limiting embodiment, at least one of the aforementioned materials are present in the core of the quantum dot.

In another embodiment, the at least one quantum dot comprises one or more materials selected from the group consisting of mixtures of InP/ZnSe, InP/ZnS, InP/ZnS/ZnSe, CdS/ZnS, CdS/ZnSe, CdSe/ZnS, CdSe/ZnSe, CdS/ZnS/ZnSe, CdSe/ZnS/ZnSe, $CuInS_2$/$CuInSe_2$ (so-called alloys). In one aspect of this embodiment, the quantum dot comprises one or more of these materials in the shell. In another aspect of this embodiment, the quantum dot comprises one or more of these materials in the core. In yet another aspect of this embodiment, the quantum dot comprises only a core and no shell.

Non-limiting quantum dots include, for example, CdSe, CdS, InP, ZnSe, ZnS, PbS, $CuInS_2$, $CuInSe_2$.

The quantum material comprises at least one ligand, wherein at least one of the ligands comprises a first functional group and a second functional group that are bound to each other by a bridge.

In one embodiment, the quantum material comprises at least two ligands, each of the ligands comprising a first functional group and a second functional group, wherein each of the first functional group is bridged to each of the second functional group.

In another embodiment, the quantum material comprises at least one ligand, wherein at least one of the ligands comprises a first functional group and a second functional group that are bound to each other by a bridge and at least another organic ligand.

The first functional group is configured to form a bond to the quantum dot, such as to the shell of the quantum dot in case of a core-shell-structure of the quantum dot.

Thus, in one embodiment, the first functional group of the ligand is bound to the quantum dot.

In one embodiment, the first functional group is a carboxylate residue, thiocarboxylate residue, or a thiolate residue. A carboxylate has the general structure R—C(O)O—, a thiocarboxylate has the general structure R—C(O)S—, and a thiolate has the general structure R—S—. In case of a carboxylate, binding to the quantum dot is by oxygen, in case of a thiocarboxylate, binding to the quantum dot is by sulfur, in case of a thiolate, binding to the quantum dot is by sulfur. By the letter 'R' the remaining structure of the ligand is generally represented and by —C(O)O—, —C(O)S— or —S— the first functional group is identified.

In another embodiment, the first functional group may also be a triarylphosphite group.

The ligand also comprises a second functional group.

In one embodiment, the second functional group of the ligand comprises a hole transport structure or an electron transport structure. By a hole transport structure a structure is meant main task of which is to transport positive charges and which, for example, comprises one or more triarylamino or carbazolyl group(s). By an electron transport structure a structure is meant, the main task of which is to transport electrons and which, for example, has one or more pyridyl or imidazolyl group(s).

The choice of the second functional group can influence the transfer of negative or positive charge carriers to the quantum dot. For example, the transfer of positive charge carriers to the quantum dot can be improved by the choice of a so-called hole-transport matrix as the second functional group. By choosing a so-called electron transport material as a second functional group, transfer of negative charge carriers to the quantum dot can be improved.

The second functional group may be an aromatic group. More generally, an aromatic group is understood to be a system in which all atoms are in $sp^2$-hybridization. In one aspect of this embodiment, the second functional group is a heterocyclic aromatic (i.e., heteroaryl) group, wherein the heteroatom is nitrogen, oxygen, or sulfur. In a non-limiting embodiment, the second functional group is an N-heteroaryl moiety. Thus, the second functional group may comprise a derivative of azole, diazole (e.g. imidazole, pyrazole), carbazole, triazole, tetrazole, azine (e.g., pyridine), diazine (e.g. pyrimidine), triazine, tetrazine, azepine, diazepine, oxazole, dioxazole, benzimidazole, or indole.

In one embodiment, the second functional group is an optionally substituted aryl or heteroaryl moiety (e.g., N-heteroaryl moiety). The substituents may be selected from alkyl (e.g., methyl, ethyl, propyl, isopropyl), aryl (e.g. phenyl), halogen (e.g. fluorine, chlorine, bromine, iodine) or CN, and others.

In one embodiment, the second functional group is selected from the group consisting of 3,5-bis(N-carbazolyl) phenyl, 2,6-bis(9H-carbazol-9-yl)pyrid-4-yl, 4,4-bis[N,N-bis(4-methylphenyl)benzolamine]cyclohexylidenyl, 4,4'-bis[2-naphthyl(phenyl)amino]diphenylamine, bis(4-carbazoyl-9-ylphenyl)amine, bis[4-(diethylamino)phenyl]amine, 3,5-bis(diphenylamino)phenyl, 3,5-bis[(3-methylphenyOphenylaminojphenyl, 4,4'-bis[2-naphthyl(phenyl)amino]triphenylamine, 4,4-bis[phenyl(m-tolyl) amino]triphenylamine and di-p-tolylamine. The aforementioned groups are groups that are especially suitable for hole transport. In other words, the aforementioned groups can especially be used to transfer positively charged charge carriers to the quantum dot.

Non-limiting second functional groups are 3,5-bis(N-carbazolyl)phenyl, 3,5-bis(diphenylamino)phenyl, 2,6-bis (9H-carbazol-9-yl)pyrid-4-yl, 3,5-bis(diphenylamino)phenyl, 1,4-bis(diphenylamino)phenyl, di-p-tolylamine.

In one embodiment, the second functional group is selected from the group consisting of di[3-(3-pyridyl)mesityl]boranyl, 4,6-bis(3,5-di(pyridin-3-yl)phenyl)-pyrimidin-2-yl, 3,5-bis(3,5-dipyrid-3-ylphenyl)phenyl, 3,5-di(m-pyridin-3-ylphenyl)phenyl and 3,5-di[(1-phenyl)-1-H-benzimidazol-2-yl]phenyl. The aforementioned groups are radicals that are especially suitable for electron transport. In other words, the aforementioned groups can especially be used to transfer negatively charged charge carriers to the quantum dot.

Non-limiting second functional groups are 3,5-bis(3,5-dipyrid-3-ylphenyl)phenyl, 4,6-bis(3,5-di(pyridin-3-yl)phenyl)-pyrimidin-2-yl, 3,5-di(m-pyridin-3-ylphenyl)phenyl and 3,5-di[(1-phenyl)-1-H-benzimidazol-2-yl]phenyl.

In one embodiment, a quantum material comprises at least one ligand having a second functional group that is suitable for electron transport and at least one ligand having a second functional group that is suitable for hole transport.

Thus, in one embodiment, a quantum material may comprise:
a quantum dot having at least two ligands, wherein the at least two ligands each comprise:
a first functional group and a second functional group bound by a bridge,
wherein the bridge comprises a system of conjugated double bonds;
wherein in at least one ligand the second functional group has an electron transport structure; and
wherein in at least one ligand the second functional group has a hole transport structure.

The functional groups having electron transport structure and the functional groups having hole transport structure may be selected from the foregoing groups.

The first functional groups are bound to the second functional groups by a bridge. The bridge comprises a system of conjugated double bonds. Conjugated double bonds means a collection of at least two C═C double bonds. Thus, more generally, the bridge may be an alkene (polyene) group or an aromatic group, each comprising a system of conjugated double bonds.

In another embodiment, the bridge comprises at least one heteroatom, wherein the heteroatom may be nitrogen, oxygen or sulfur. In a non-limiting embodiment, the heteroatom is nitrogen.

Most generally, the bridge may have the formula $R_1$-$R_2$-$R_3$, wherein $R_1$ is bound to the first functional group and $R_3$ is bound to the second functional group, wherein $R_1$ may independently be selected from $C_x$-alkyl, $C_x$-heteroalkyl, $C_x$-aryl, $C_x$-heteroaryl, wherein x is selected from 0-10, such as 3-6, or 3-5.

$R_2$ can independently be (—C≡C—)$_n$, wherein n is selected from 0-10, such as 3-9, or 4-5, wherein $R_3$ may independently be selected from $C_y$-alkyl, $C_y$-heteroalkyl, $C_y$-aryl, $C_y$-heteroaryl, wherein y is selected from 0-16, such as 1-12, or 2-6.

In one embodiment, the bridge comprises at least one aromatic system.

As an example, the bridge may be an optionally substituted phenyl/pyridyl, an optionally Substituted phenyl-pyridyl group, of an optionally substituted biphenyl/bi-pyridyl group, wherein the groups, may have no, one, or more substituents. Optional substituents may be an aliphatic radical, a halogen, OH, CN, $NO_2$, $OCH_3$, Oalkyl, or $CF_3$.

In one embodiment, the bridge may comprise groups having a hole transport function, such as a phenyl group or a biphenyl group.

In a non-limiting embodiment, the bridge comprises a group having a hole transport function, and the second functional group has a hole transport function.

In an alternative non-limiting embodiment, the bridge comprises a group having an electron transport function, and the second functional group has an electron transport function.

Exemplary groups for combining a first functional group and a bridge are derivatives of phenylcarboxylic acids (e.g., benzoic acid and pyridinecarboxylic acids). Exemplary phenylcarboxylic acids based on benzoic acid are trans-cinnamic acid and substituted derivatives thereof such as trans-2-nitrocinnamic acid or trans-2-trifluoromethylcinnamic acid, examples of pyridinecarboxylic acids are derivatives of picolinic acid, derivatives of nicotinic acid and derivatives of isonicotinic acid.

In a non-limiting embodiment, at least one additional organic ligand is bound to the quantum dot.

The organic ligand may be an optionally substituted aliphatic or optionally substituted aromatic ligand. By an optionally substituted aliphatic ligand a ligand is meant which exclusively consists of carbon and hydrogen and is not aromatic and is optionally substituted, for example, with at least one aliphatic radical, a halogen, OH, CN, $NO_2$, $OCH_3$, O-alkyl, and/or $CF_3$. By an optionally substituted aromatic ligand a ligand is meant which has at least one aromatic group. This may be, for example, a heteroaromatic, or an exclusively carbon-containing aromatic group. The aromatic group may further be substituted with, for example, at least one aliphatic radical, an aromatic radical, a halogen, OH, CN, $NO_2$, $OCH_3$, Oalkyl, and/or $CF_3$. In one embodiment, at least one optionally substituted aliphatic ligand and at least one optionally substituted aromatic ligand is bound to the quantum dot.

A method of producing a quantum material comprising the steps of:
  providing at least one quantum dot,
  contacting the at least one quantum dot with a ligand precursor comprising a first functional group and a second functional group bound to each other by a bridge, wherein the bridge comprises a system of conjugated double bonds.

Methods for producing quantum materials are also described in the literature (e.g., "Design of High Performance Indium Phosphide (InP)-based Quantum Dot Light Emitting Diodes (QLEDs)", Yohan KIM, PhD thesis, Berlin 2018).

The quantum material, quantum dot, functional groups, and bridge may be any one of the embodiments disclosed herein.

In one embodiment, the quantum dot is pre-prepared in a suitable solvent and is contacted with a ligand precursor. A ligand precursor may be a ligand as described herein that additionally has a leaving group. Thus, a ligand precursor comprises a first functional group, a second functional group, a bridge and a leaving group.

Most generally, a leaving group is understood to be a chemical group, molecular fragment, cation or anion that is cleaved off in a chemical reaction. The leaving group may, for example, be $H^+$, $Na^+$, $K^+$, $Li^+$, and $NH_4^+$.

When the ligand precursor is brought into contact with the quantum dot, the leaving group is cleaved off and the ligand is thus bound to the quantum dot.

In a non-limiting embodiment, a ligand present at the quantum dot is cleaved off at the same time. Ligand exchange can thus take place in a so-called ligand exchange reaction. In a non-limiting embodiment, at least one ligand is bound to the quantum dot in such a manner. In one embodiment, at least two ligands are bound to the quantum dot in such a manner, at least a second functional group having an electron transport function and at least a second functional group having a hole transport function.

In another embodiment, the quantum dot comprising at least one ligand is separated from the solvent and dried. In this regard, drying is carried out, for example, by heating.

Furthermore, an optoelectronic semiconductor component comprising at least one quantum material. An optoelectronic semiconductor component especially is an OLED (organic light emitting diode), a QLED (quantum dot light emitting diode), or a combination thereof.

In one embodiment, an optoelectronic semiconductor component comprises a cathode, an anode, an electron transport material, optionally an electron injection material, a quantum material, a hole transport material, and optionally a hole injection material.

In a non-limiting embodiment, the optoelectronic semiconductor component has a layered structure. Herein, the anode and the cathode respectively form the outer layers, which optionally may furthermore be coated. On the sides facing each other, there is a layer of hole transport material located on the anode side and optionally a layer of hole injection material. On the cathode side, on the side facing the anode, there is a layer of electron transport material and optionally a layer of electron injection material. The layer of quantum material is located in the center of the layered arrangement and is adjacent to the hole transport material on one side and the electron transport material on the other side.

The arrangement of the individual layers may mean that the layers are arranged directly in direct mechanical and/or electrical contact with one of the two other layers. Alternatively, it may mean that the one layer is arranged in indirect contact with one of the two other layers and in direct mechanical and/or electrical contact or in indirect contact with other layers. In the case of indirect contact, further layers may then be arranged between the one layer and at least one of the two other layers.

In optoelectronic semiconductor devices, especially in OLEDs and QLEDs, balanced charge transport is important, i.e. there must be a balance between electrons and holes. For example, to generate light in a quantum material, i.e., in a light-emitting layer of an OLED or a QLED, an exciton formed by the hole and an electron is necessary for the emission of light, so there should be as many electrons and holes as possible in the light-emitting layer to obtain an efficient semiconductor component. Lifetime can also be improved by good charge balance, as excess charge carriers, for example holes or radicals, can lead to degradation, for example oxidation of the materials.

The materials for the cathode, the anode, the electron transport material, the electron injection material, the hole transport material and the hole injection material may each be materials as described in the prior art.

Further advantageous embodiments and further embodiments will be apparent from the embodiments described below in connection with the figures.

BRIEF DESCRIPTION OF THE DRAWINGS

Elements that are equal, similar or have the same effect are identified by the same reference numbers in the figures. The figures and the proportions of the elements illustrated in the figures are not to be regarded as true to scale.

Individual elements may rather be illustrated in exaggerated size for better representability and/or better understanding.

DETAILED DESCRIPTION

Figure 1:
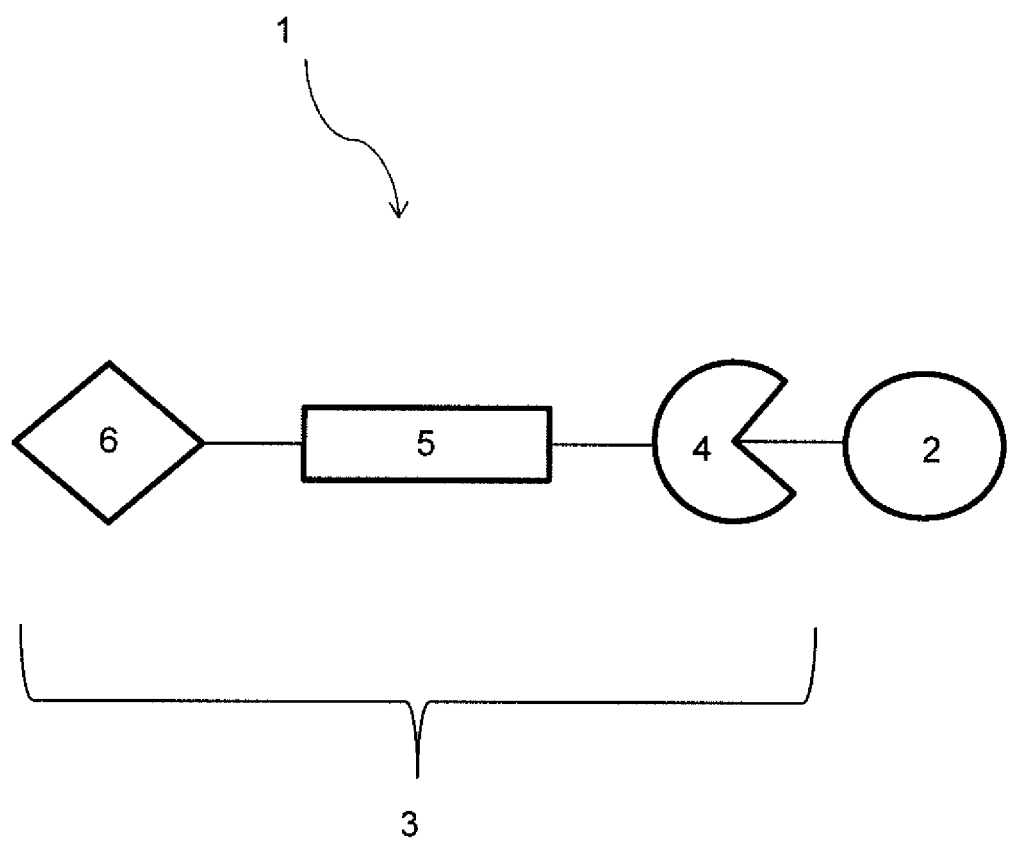
FIG. 1 illustrates a schematic representation of a quantum material.

FIG. 1 schematically illustrates a quantum material 1. The quantum material 1 comprises a quantum dot 2 and a ligand 3. The ligand 3 as illustrated schematically comprises a first functional group 4, a second functional group 6, the first functional group 4 and the second functional group 6 being bound to each other by a bridge 5.

Figure 2:
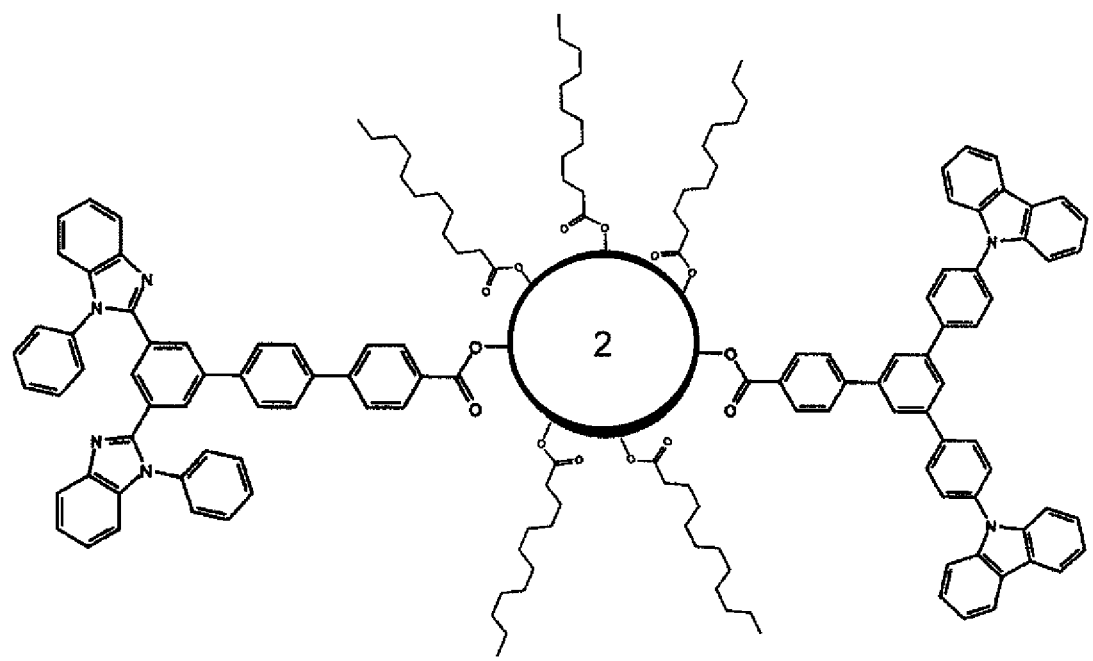
FIG. 2 illustrates an exemplary quantum material.

FIG. 2 illustrates an exemplary quantum material 1. Seven ligands are bound to the quantum dot 2 in this case. Other organic ligands as well as ligands may be bound to quantum dot 2 (not illustrated in FIG. 2). In the seven ligands illustrated, five aliphatic ligands and two functional ligands 3 are bound to quantum dot 2. Among the functional ligands 3, one ligand has a hole transport function and one ligand has an electron transport function.

Figure 3:
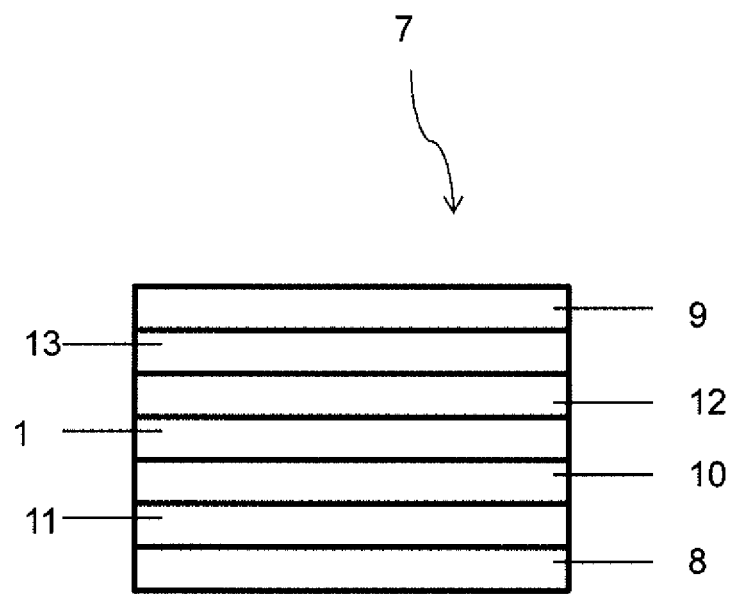
FIG. 3 illustrates an example of the structure of an optoelectronic semiconductor device.

FIG. 3 illustrates an exemplary optoelectronic semiconductor component 7, wherein a quantum material 1 for emitting light of a specific wavelength is located in the center of the optoelectronic semiconductor component 7. The quantum material 1 is surrounded by a layer of a hole transport material 10 and a layer of an electron transport material 12. Furthermore, there may optionally be a layer of a hole injection material 11 and a layer of an electron injection material 13. Furthermore, FIG. 3 illustrates an anode 8 and a cathode 9.

Figure 4:
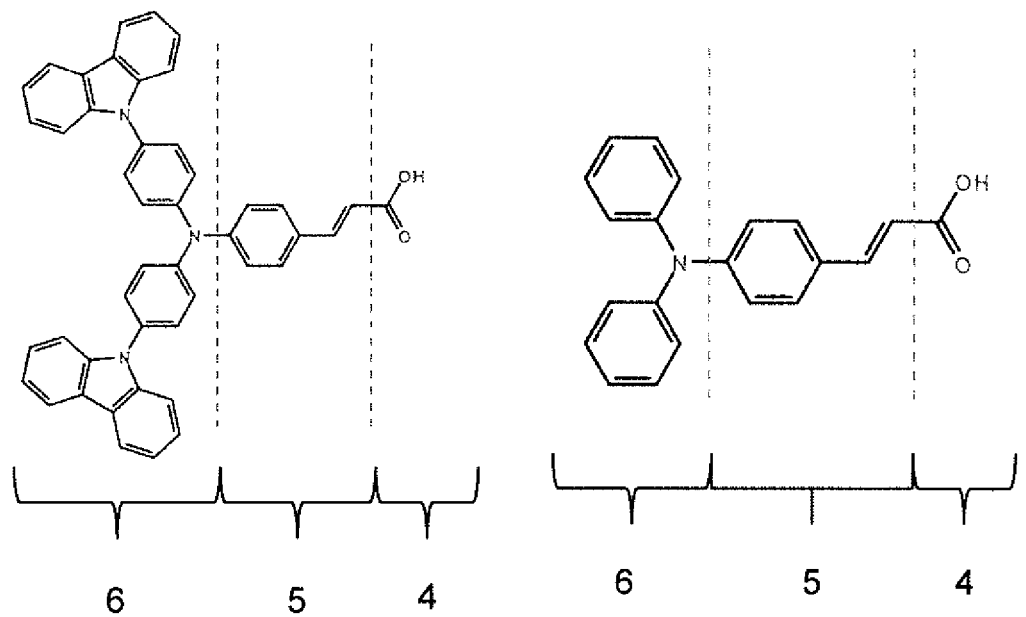
FIG. 4 illustrates exemplary precursors of ligands.
Figure 4:
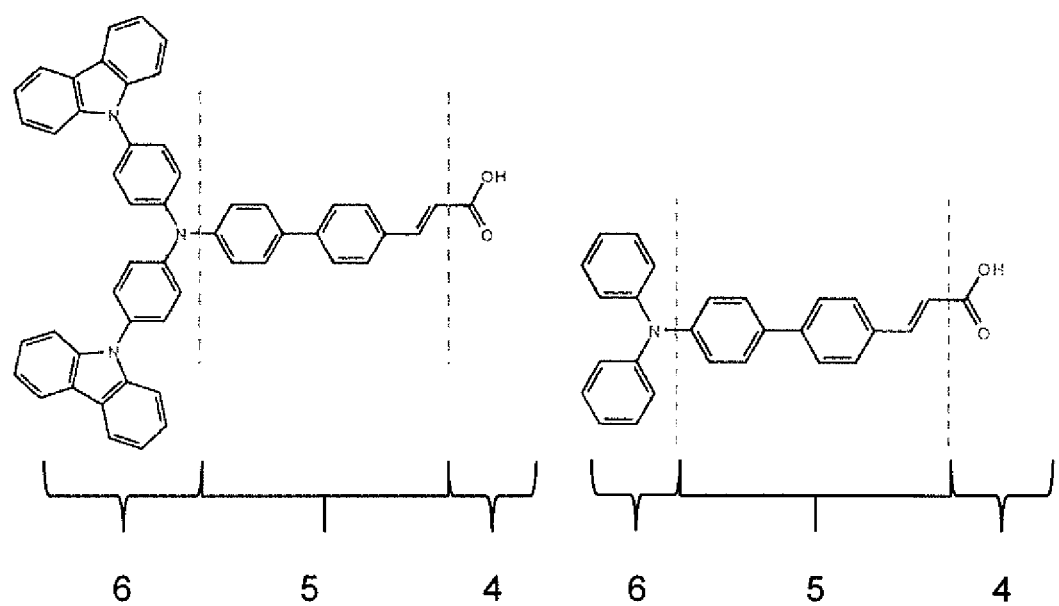

FIG. 4 illustrates exemplary precursors of ligands 3. The precursors of the ligands 3 each comprise a precursor of a first functional group 4 by means of which the ligand 3 can be bound to the quantum dot 2 (herein, a COOH group from which a carboxylate group can be formed by —H cleavage). Furthermore, exemplary bridges 5 and exemplary second functional groups 6 are illustrated herein. With the precursors of ligands 3 illustrated herein ligands 3 having hole transport function can be obtained.

Figure 5:
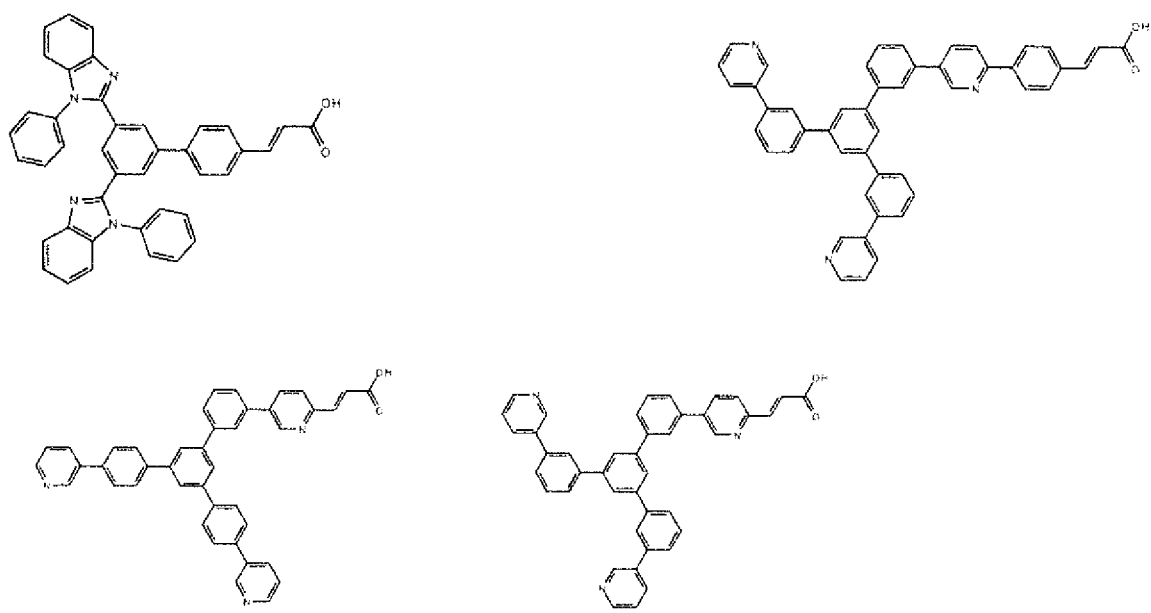
FIGS. 5 and 6 show exemplary precursors of ligands having electron transport function.
Figure 6:
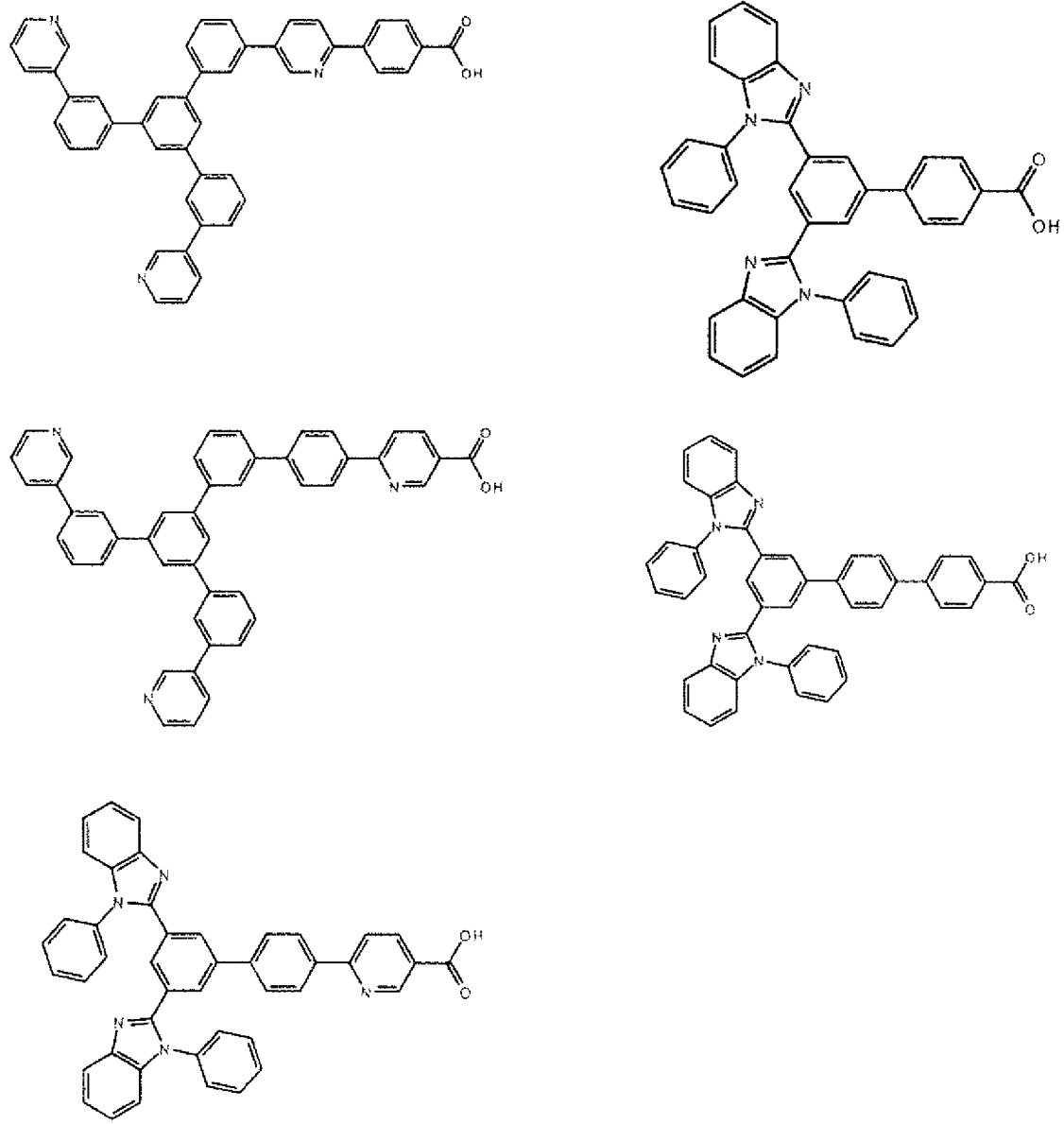

FIGS. 5 and 6 show exemplary precursors of ligands 3 having electron transport function. The precursors of the ligands 3 each comprise a precursor of a first functional group 4 by means of which the ligand 3 can be bound to the quantum dot 2 (herein, a COOH group from which a carboxylate group can be formed by —H cleavage).

Figure 7:
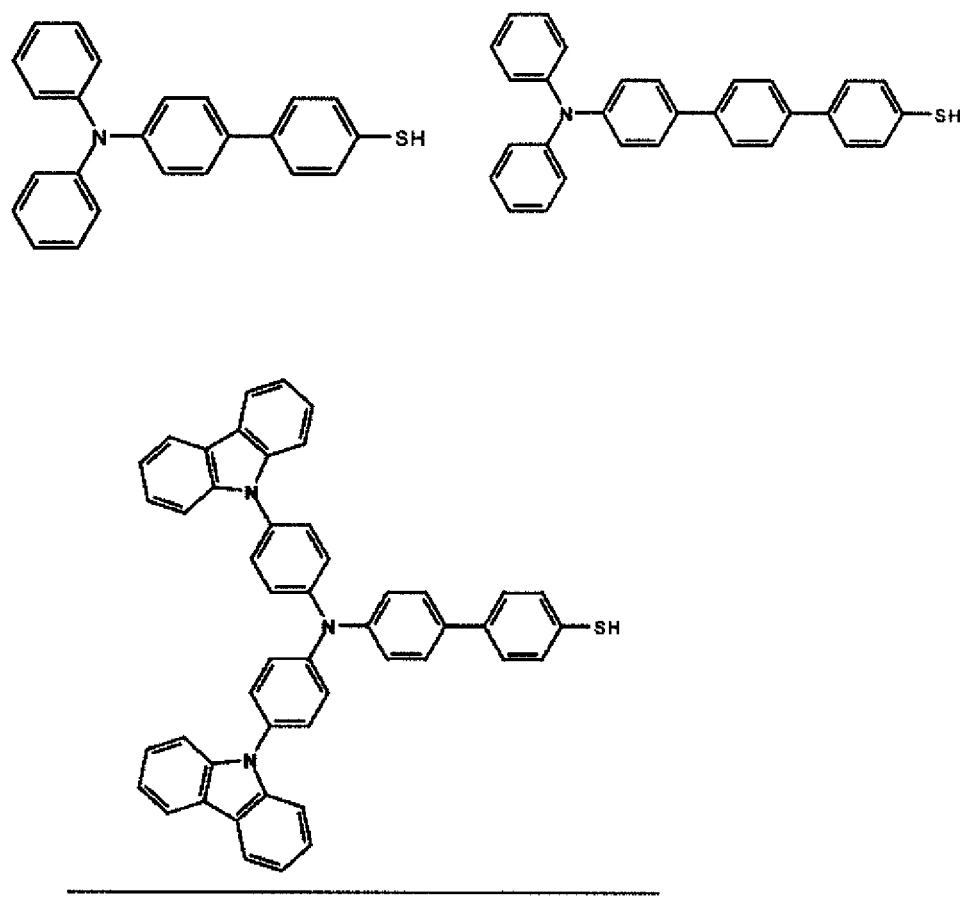
FIG. 7 illustrates exemplary precursors of ligands having hole transport function.

FIG. 7 illustrates exemplary precursors of ligands 3. The precursors of the ligands 3 each comprise a precursor of a first functional group 4 by means of which the ligand 3 can be bound to the quantum dot 2 (herein, an —SH group, from which an —S group can be formed by —H cleavage). Furthermore, exemplary bridges 5 and exemplary second functional groups 6 are illustrated herein. With the illustrated precursors of ligands 3 ligands 3 having hole transport function can be obtained.

Figure 8:
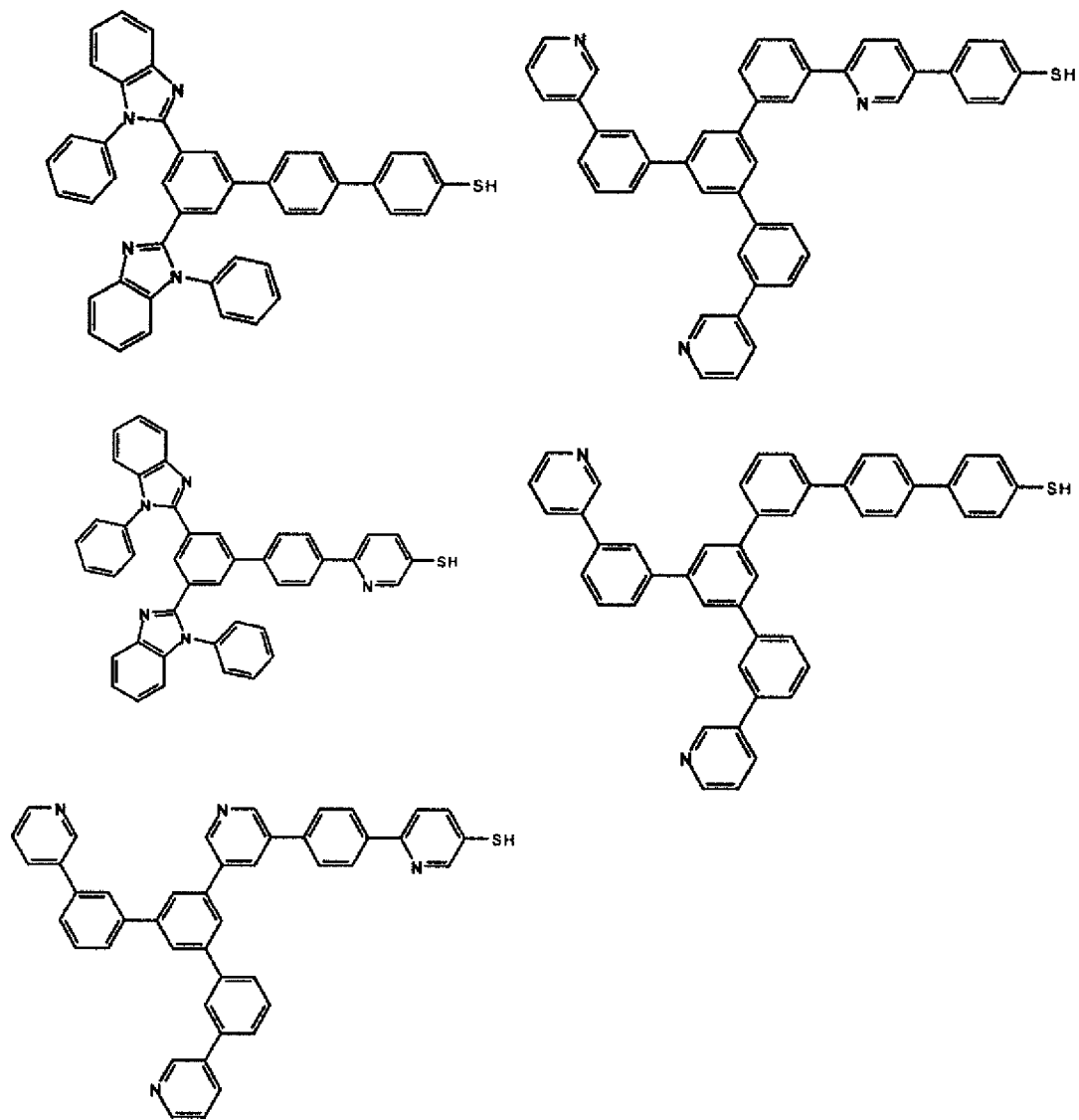
FIG. 8 illustrates exemplary precursors of ligands having electron transport function.

FIG. 8 illustrates exemplary precursors of ligands 3. The precursors of the ligands 3 each comprise a precursor of a first functional group 4 by means of which the ligand 3 can be bound to the quantum dot 2 (herein an —SH group, from which an —S group can be formed by —H cleavage). Furthermore, exemplary bridges 5 as well as exemplary second functional groups 6 are illustrated herein. With the illustrated precursors of ligands 3 ligands 3 having electron transport function can be obtained.

In order to improve the performance data of an optoelectronic semiconductor component which uses quantum materials for light generation, the organic shell of the quantum dot can be modified such that improved transport of positive and negative charge carriers to the quantum dot, and thus recombination of the charge carriers with light being emitted will be enabled. For this purpose, all or part of the aliphatic ligands of the organic shell can be replaced by ligands as described herein and serving as "functional ligands". In this regard, such a "functional" ligand comprises three molecular moieties. One molecule moiety, the first functional group, may provide anchoring of the ligand to the quantum dot (e.g., by means of a carboxylate or thiolate group). Another part of the molecule, the second functional group, can act as an "antenna" for charge carrier(s) to "capture" them, while a third part of the ligand acts as a "bridge" between these two portions of the molecule, allowing transport of the charge carriers (positive and negative) from the antenna" to the quantum material via the anchoring point. In this case, that "bridge" consists of a system of conjugated double bonds into which, for example, one to several phenyl groups are incorporated, used to transfer the charge carriers to the inorganic quantum dot. It is expected that in such a system of conjugated double bonds using ligands as a "bridge" between the charge transport function and anchoring the ligand in the organic layer of the quantum materials will significantly improve the efficiency of the quantum materials and also of the optoelectronic semiconductor components containing the same. If necessary, individual carbon atoms of the bridge function are replaced by heteroatoms, e.g. nitrogen (e.g. replacement of benzoic acid basic structures by pyridine carboxylic acid basic structures), to further improve or adapt the charge transport.

By mixing the proportions of such differently structured functional ligands in the organic shell of the quantum dot, balanced charge carrier transport to the quantum dot should be achievable.

It is expected that a purely aliphatic ligand shell arranged around a quantum dot in optoelectronic semiconductor components will make it more difficult to the charge carriers, the recombination of which on the quantum dot should enable the emission of light of a defined wavelength, to reach the quantum dot. By introducing "functional ligands" having an "antenna" function and a charge carrier transport function ("bridge"), i.e. a conjugated double bond system, the access of charge carriers to recombination on the quantum dot should significantly be facilitated, thus improving the performance data of an optoelectronic semiconductor component.

The invention is not limited thereto by the description based on the embodiments. The invention rather encompasses any new feature as well as any combination of features, which especially includes any combination of features in the patent claims, even if that feature or combination itself is not explicitly stated in the patent claims or the embodiments.

This patent application claims the priority of the German patent application 102019101217.1, the disclosure content of which is hereby incorporated by reference.

LIST OF REFERENCE NUMBERS

1 Quantum material
2 Quantum dot
3 Ligand
4 First functional group
5 Bridge
6 Second functional group
7 Optoelectronic semiconductor component
8 Anode
9 Cathode
10 Hole transport material
11 Hole injection material
12 Electron transport material
13 Electron injection material

The invention claimed is:

1. A quantum material comprising:
a quantum dot having at least two ligands, wherein the at least two ligands comprise:
a first functional group and a second functional group bound to each other by a bridge, wherein the bridge comprises a system of conjugated double bonds;
wherein, in at least one ligand, the second functional group has an electron transport structure;
wherein, in at least one ligand, the second functional group has a hole transport structure; and
wherein in the at least one ligand with an electron transport structure, the second functional group is selected from the group consisting of 3,5-bis(3,5-dipyrid-3-ylphenyl)phenyl, 4,6-bis(3,5-di(pyridin-3-yl)phenyl)-pyrimidin-2-yl, 3,5-di(m-pyridin-3-ylphenyl)phenyl, and 3,5-di[(1-phenyl)-1-H-benzimidazol-2-yl]phenyl.

2. The quantum material according to claim 1, wherein the first functional group is bound to the quantum dot.

3. The quantum material according to claim 1, wherein the first functional group is a carboxylate, thiocarboxylate, or thiolate.

4. The quantum material according to claim 1, wherein the bridge comprises at least one aromatic system.

5. The quantum material according to claim 1, wherein the bridge is selected from the group consisting of pyridyl, phenyl-pyridyl, and bipyridyl.

6. The quantum material according to claim 1, wherein the bridge is selected from the group consisting of phenyl and biphenyl.

7. The quantum material according to claim 1, wherein the quantum dot has a core-shell structure.

8. The quantum material according to claim 1, wherein the quantum dot comprises a material or combination of materials selected from the group consisting of CdSe, CdS, InP, ZnSe, ZnS, PbS, $CuInS_2$, and $CuInSe_2$.

9. A method of producing a quantum material, wherein the method comprises:
providing at least one quantum dot; and
contacting the at least one quantum dot with a ligand precursor comprising a first functional group and a second functional group bound to each other by a bridge, wherein the bridge comprises a system of conjugated double bonds;
wherein, in at least one ligand, the second functional group has an electron transport structure;
wherein, in at least one ligand, the second functional group has a hole transport structure; and
wherein in the at least one ligand with an electron transport structure, the second functional group is selected from the group consisting of 3,5-bis(3,5-dipyrid-3-ylphenyl)phenyl, 4,6-bis(3,5-di(pyridin-3-yl)phenyl)-pyrimidin-2-yl, 3,5-di(m-pyridin-3-ylphenyl)phenyl, and 3,5-di[(1-phenyl)-1-H-benzimidazol-2-yl]phenyl.

10. An optoelectronic semiconductor component comprising:
at least one quantum material according to claim 1.

11. A quantum material comprising:
a quantum dot having at least two ligands, wherein the at least two ligands comprise:
a first functional group and a second functional group bound to each other by a bridge, wherein the bridge comprises a system of conjugated double bonds;
wherein, in at least one ligand, the second functional group has an electron transport structure;
wherein, in at least one ligand, the second functional group has a hole transport structure; and
wherein in the at least one ligand with a hole transport structure, the second functional group is selected from the group consisting of 3,5-bis(N-carbazolyl)phenyl, 3,5-bis(diphenylamino)phenyl, and 2,6-bis(9H-carbazol-9-yl)pyrid-4-yl.

12. A method of producing a quantum material, wherein the method comprises:
providing at least one quantum dot; and
contacting the at least one quantum dot with a ligand precursor comprising a first functional group and a second functional group bound to each other by a bridge, wherein the bridge comprises a system of conjugated double bonds;
wherein, in at least one ligand, the second functional group has an electron transport structure;
wherein, in at least one ligand, the second functional group has a hole transport structure; and
wherein in the at least one ligand with a hole transport structure, the second functional group is selected from the group consisting of 3,5-bis(N-carbazolyl)phenyl, 3,5-bis(diphenylamino)phenyl, and 2,6-bis(9H-carbazol-9-yl)pyrid-4-yl.

\* \* \* \* \*